United States Patent [19]
Hwang et al.

[11] Patent Number: 5,523,184
[45] Date of Patent: Jun. 4, 1996

[54] PHOTOMASK FOR FORMING HIGH RESOLUTION PHOTORESIST PATTERNS

[75] Inventors: Joon Hwang; Jae S. In, both of Bubaleub, Rep. of Korea

[73] Assignee: Hyundai Electronics Industries Co., Ltd., Rep. of Korea

[21] Appl. No.: 247,705

[22] Filed: May 23, 1994

[30] Foreign Application Priority Data

May 21, 1993 [KR] Rep. of Korea ............... 1993-8832

[51] Int. Cl.$^6$ ...................................... G03F 9/00
[52] U.S. Cl. ........................ 430/5; 430/321; 430/396
[58] Field of Search .................... 430/5, 321, 396

[56] References Cited

U.S. PATENT DOCUMENTS 5,288,569  2/1994  Lin ............................................. 430/5

Primary Examiner—S. Rosasco
Attorney, Agent, or Firm—Merchant, Gould, Smith, Edell, Welter & Schmidt

[57] ABSTRACT

A photomask capable of forming a photoresist pattern including a chrome dot formed at the center of a reticle, adapted to attenuate light exposure energy strength concentrated at the center of the photomask, is disclosed. The chrome dot is capable of compensating for the limited resolution exhibited at edges of the pattern due to an intrinsic wave surging property of light source used and, thus, obtaining a high resolution. The photomask makes it possible to easily obtain a photoresist pattern on a highly integrated semiconductor device.

5 Claims, 3 Drawing Sheets

5,523,184

PHOTOMASK FOR FORMING HIGH RESOLUTION PHOTORESIST PATTERNS

BACKGROUND OF THE INVENTION

1. Field of the Invention

The present invention relates to a method for forming photoresist patterns in the fabrication of a semiconductor device, and more particularly to a photomask for forming a high resolution photoresist pattern, capable of attenuating a light exposure energy with its strength concentrated on the center of the mask pattern being formed.

2. Description of the Prior Art

For clearly defining an outline with a minimum linear width by use of a photoresist film in a photo-masking process, there have been efforts to improve the resolution. These efforts have led to various process developments such as development of photoresist films exhibiting good characteristics and reduction of the wavelength of the light emitted from a light source or other light exposure equipment. However, the developed techniques can not solve a problem that the photoresist pattern exhibits a limited resolution due to an intrinsic wave surging property of the light source.

A conventional photomask for forming a photoresist pattern will now be described, in conjunction with FIGS. 1A to 1C.

As shown in FIG. 1A, the photomask has a chrome pattern 2 formed on a reticle 1 and is identical to a pattern for forming a contact hole. The photomask has an energy distribution that the energy peak is exhibited at the center of a portion of the photomask where the chrome pattern 2 is not present, as shown in FIG. 1B. In the photomask, energy is distributed symmetrically with respect to the energy peak point and gradually reduced toward opposite lateral edges of the photomask. As a result, a considerably low light exposure energy strength is exhibited at the lateral edges of the chrome pattern 2, thereby considerably degrading the resolution.

In other words, formation of a photoresist pattern using the above-mentioned conventional photomask involves a degradation in resolution because the photoresist film is partially left along predetermined boundaries between the chrome and the non-chrome (a' and b' in FIG. 1C).

SUMMARY OF THE INVENTION

Therefore, an object of the invention is to solve the above-mentioned problems encountered in the prior art and, thus, to provide a photomask capable of forming a photoresist pattern exhibiting a high resolution.

In accordance with the present invention, this object can be accomplished by providing a photomask for forming a high resolution photoresist pattern on a reticle, comprising light exposure energy attenuation means formed on a portion of the reticle, on which the strength of the light exposure energy is concentrated, and adapted to attenuate the concentrated light exposure energy.

BRIEF DESCRIPTION OF THE DRAWINGS

Other objects and aspects of the invention will become apparent from the following description of embodiments with reference to the accompanying drawings in which:

FIG. 20 is a plan view illustrating a photoresist pattern formed by use of the photomask shown in FIG. 2A.

DETAILED DESCRIPTION OF THE PREFERRED EMBODIMENT

Figure 1A:
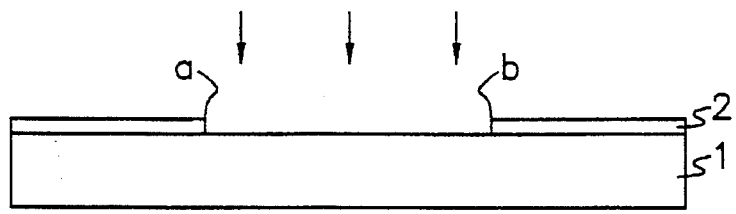
FIG. 1A is a sectional view illustrating the formation of a photoresist pattern using a conventional photomask.
Figure 1B:
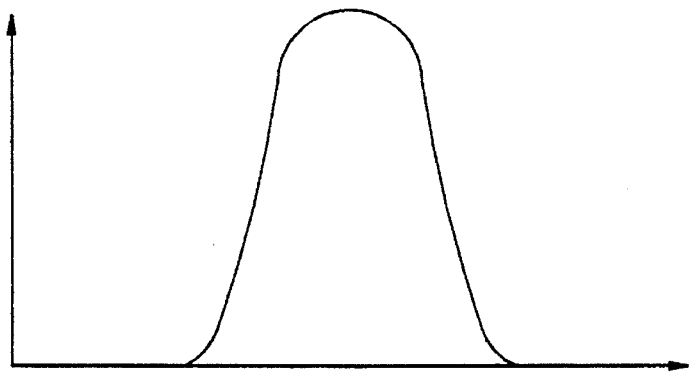
FIG. 1B is a diagram illustrating an energy distribution exhibited when a light exposure is carried out using the photomask of FIG. 1A.
Figure 1C:
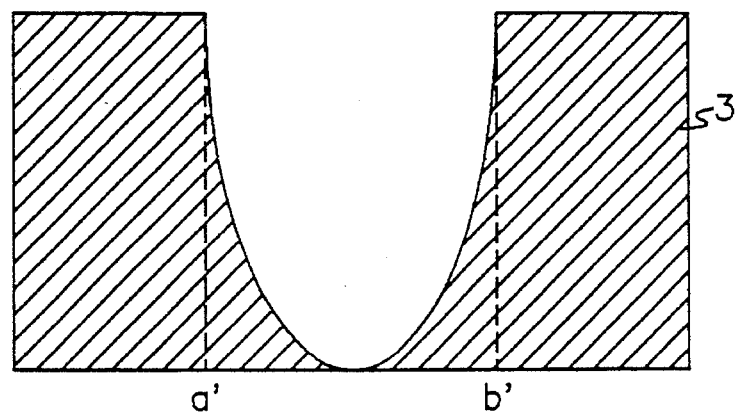
FIG. 1C is a plan view illustrating a photoresist pattern formed by use of the photomask shown in FIG. 1A.
Figure 2A:
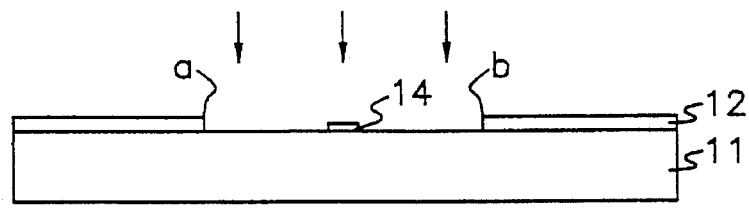
FIG. 2A is a sectional view illustrating the formation of a photoresist pattern using a photomask in accordance with the present invention.
Figure 2B:
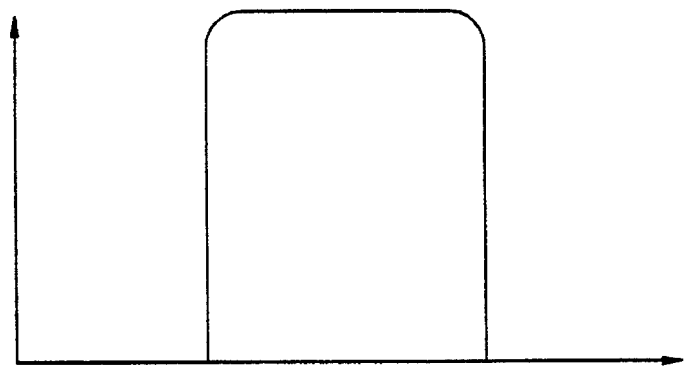
FIG. 2B is a diagram illustrating an energy distribution exhibited when a light exposure is carried out using the photomask of FIG. 2A.

FIG. 2A is a sectional view illustrating the formation of a photoresist pattern using a photomask in accordance with the present invention. In FIG. 2A, the reference numerals 11 and 12 denote a reticle and a chrome pattern, respectively. As shown in FIG. 2A, the photomask of the present invention includes the chrome pattern 12 formed on the reticle 11. In accordance with the present invention, the photomask further includes a chrome dot 14 formed at the center of the reticle 11 as a means for decreasing light exposure energy concentrated at the center of the photomask. By the chrome dot 14, the photomask has a total uniform light exposure energy distribution as shown in FIG. 2B. For obtaining such a uniform light exposure energy distribution in the photomask formed with the chrome dot 14, it is necessary to use light exposure energy having a strength higher than that of the conventional case by 10%.

Figure 2C:
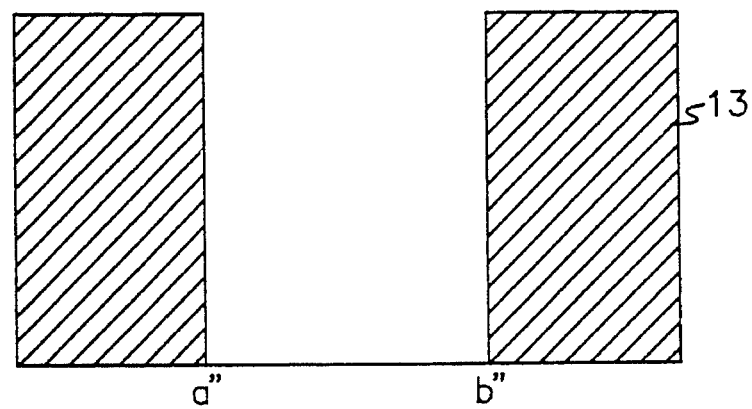

After a development, a photoresist pattern 13 is obtained. As shown in FIG. 2C, the photoresist pattern 13 has a structure including no portion left beyond predetermined edges "a and b" thereof.

Figure 3:
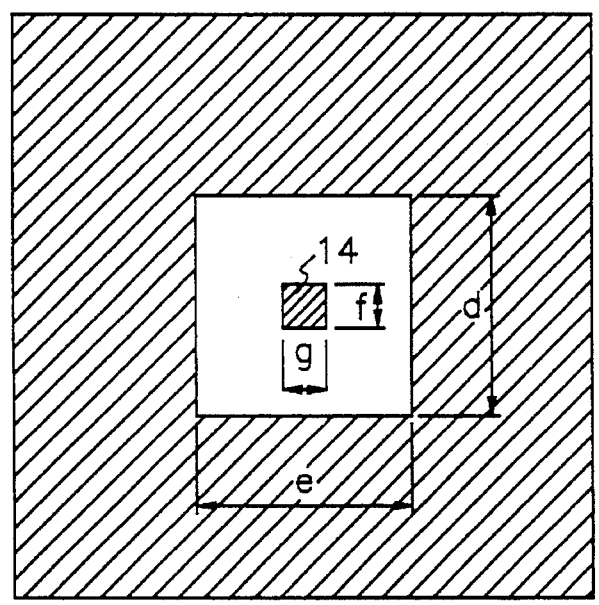
FIG. 3 is a plan view illustrating a photomask in accordance with an embodiment of the present invention for forming a contact hole.

FIG. 3 is a plan view illustrating a photomask in accordance with an embodiment of the present invention for forming a contact hole. As shown in FIG. 3, the size (f×g μm$^2$) of the chrome dot 14 formed at the center of the non-chrome region having the size of d×e μm$^2$ is variable within 10% of the size (e×d μm$^2$) of the total contact hole region, depending on the characteristic of a light exposure equipment used. Where the size of the chrome dot 14 is excessive, the light exposure energy strength is rather decreased, thereby causing a scum to be left. At an insufficient size of the chrome dot 14, the effect intended is obtained insufficiently. When the chromium dot is centrally positioned, a maximum effect can be obtained.

Figure 4:
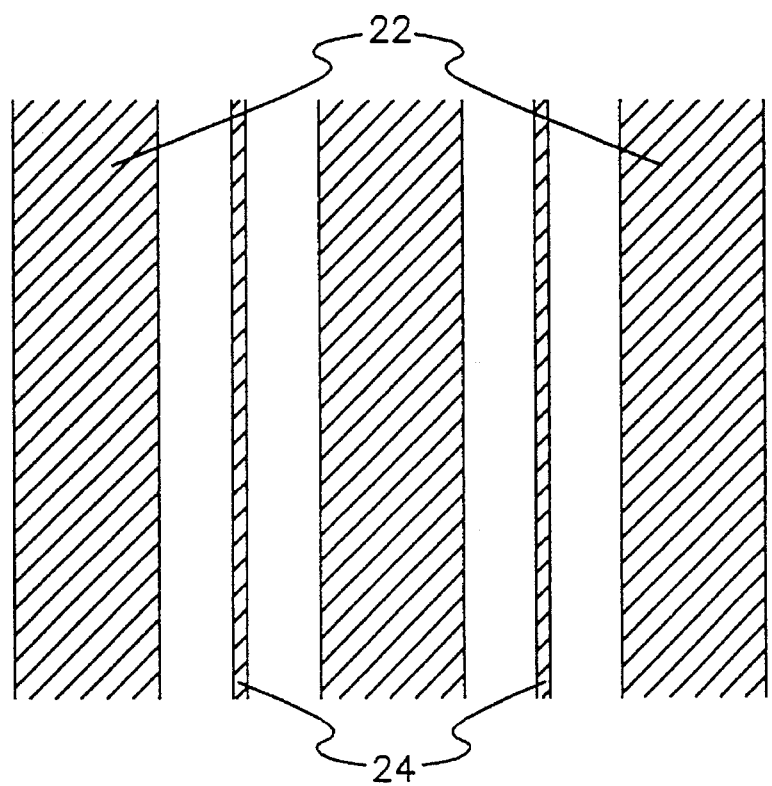
FIG. 4 is a plan view illustrating a photomask in accordance with another embodiment of the present invention.

FIG. 4 is a plan view illustrating a photomask in accordance with another embodiment of the present invention. This photomask can be employed for patterning lines.

In this case, the photomask comprises a chromium pattern including spaced wide chromium lines 22 each having a predetermined linear width. In accordance with the same concept as in the above-mentioned embodiment, the photomask further comprises narrow chromium lines 24 each having a very narrow linear width and formed between adjacent wide chromium lines 22, so as to attenuate the light exposure energy strength. As a light exposure is carried out using an increased energy strength, the narrow chromium lines serve to prevent photoresist pattern material from being left beyond predetermined line regions. As a result, an improvement in resolution is achieved.

As is apparent from the above description, the present invention provides a photomask capable of forming a photoresist pattern, capable of compensating a limited resolution exhibited at edges of the pattern due to an intrinsic wave surging property of a light source used, thereby obtaining a high resolution. Accordingly, it is possible to easily obtain a photoresist pattern on a highly integrated semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A photomask for forming a high resolution photoresist pattern in an underlying photosensitive material, comprising:
    a primary chromium pattern formed on a transparent reticle, the primary chromium pattern including a peripheral chromium area and a transparent area within the peripheral chromium area; and
    an auxiliary chromium pattern formed on the transparent reticle in the transparent area for equalizing light intensity, both the auxiliary chromium pattern and the primary chromium pattern being cooperatingly sized whereby a corresponding pattern on the underlying photosensitive material is can be developed as a contact hole.

2. The photomask in accordance with claim 1, wherein said auxiliary pattern comprises a chromium dot.

3. The photomask in accordance with claim 2, wherein the peripheral chromium area, the transparent area and the chromium dot are rectangular and concentric, and the area of the chromium dot is approximately ten percent of that of the transparent area.

4. A photomask for forming a high resolution photoresist pattern in an underlying photosensitive material, comprising:
    a primary chromium pattern formed on a reticle, the primary chromium pattern including at least a plurality of a substantially linear elongate chromium areas and a transparent area within the elongate chromium areas;
    an auxiliary chromium pattern formed on a portion of said reticle within said transparent area, both the auxiliary chromium pattern and the primary chromium pattern being cooperatingly sized a whereby a corresponding portion of the underlying photosensitive material is not exposed when forming a photoresist pattern.

5. The photomask in accordance with claim 4, wherein said auxiliary chromium pattern is a chromium line.

* * * * *